(12) United States Patent
Beasom

(10) Patent No.: US 6,555,894 B2
(45) Date of Patent: *Apr. 29, 2003

(54) DEVICE WITH PATTERNED WELLS AND METHOD FOR FORMING SAME

(75) Inventor: James D. Beasom, Melbourne Village, FL (US)

(73) Assignee: Intersil Americas Inc., Irvine, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/062,964

(22) Filed: Apr. 20, 1998

(65) Prior Publication Data

US 2002/0158312 A1 Oct. 31, 2002

(51) Int. Cl.[7] ..................... H01L 27/082; H01L 27/102; H01L 29/70
(52) U.S. Cl. ......................... 257/593; 257/565; 257/592
(58) Field of Search ................................. 257/370, 583, 257/585, 592, 593, 565, 345, 344

(56) References Cited

U.S. PATENT DOCUMENTS

| | | | | |
|---|---|---|---|---|
| 3,331,001 A | * | 7/1967 | Luce et al. ................. | 257/593 |
| 4,532,003 A | * | 7/1985 | Beasom ....................... | 257/593 |
| 4,697,198 A | * | 9/1987 | Komori et al. ............. | 257/345 |
| 4,927,772 A | | 5/1990 | Arther et al. | |
| 5,153,694 A | * | 10/1992 | Kishi ........................... | 257/593 |
| 5,548,158 A | * | 8/1996 | Bulucea et al. ............. | 257/592 |
| 5,623,154 A | * | 4/1997 | Murakami et al. .......... | 257/345 |
| 5,903,029 A | * | 5/1999 | Hayashida et al. ......... | 257/345 |

FOREIGN PATENT DOCUMENTS

| | | | | |
|---|---|---|---|---|
| JP | 54-50277 | * | 4/1979 | ................. 257/106 |
| JP | 63-18672 | * | 1/1988 | ................. 257/593 |
| JP | 2-312243 | * | 12/1990 | ................. 257/593 |
| JP | 8-321604 | * | 12/1996 | ................. 257/369 |

OTHER PUBLICATIONS

Stork, J.M.C. and Plummer, James D; Small Goemetry Depleted Base Bipolar Transistors (BSIT)–VSLI Devices?; IEEE; Nov. 1981, pp. 1354–1363; vol. Ed–28, No. 11.

* cited by examiner

Primary Examiner—Steven Loke
(74) Attorney, Agent, or Firm—Fogg and Associates, LLC

(57) ABSTRACT

In a semiconductor substrate having a top surface and a PN junction between a first region of one conductivity type formed by masked diffusion into a semiconductor from the surface and a second region of opposite conductivity type formed into a first portion of the first region from the surface, the improvement comprises one edge of the first region being spaced from the edge of the second region such that the doping concentration of the first region at the surface intersection of the four corners of the junction between the first and second regions is lower than it is at some other location in the region. A semiconductor device comprises: a substrate with a surface; a first region of one conductivity type that is defined by a first perimeter at the surface, extends from the surface to a first depth, and has a doping concentration that decrease with depth and with proximity to the first perimeter; and a second region of opposite conductivity type that is defined by a second perimeter, extends from the surface to a second depth, and has a doping concentration that decreases with depth and with proximity to the second perimeter. The second region overlaps the first region, and the doping concentration of the first region at the surface intersection of the first and second regions is less than the maximum doping concentration at other locations on the surface within the first perimeter where the second region overlaps the first region.

11 Claims, 11 Drawing Sheets conventional device higher breakdown device

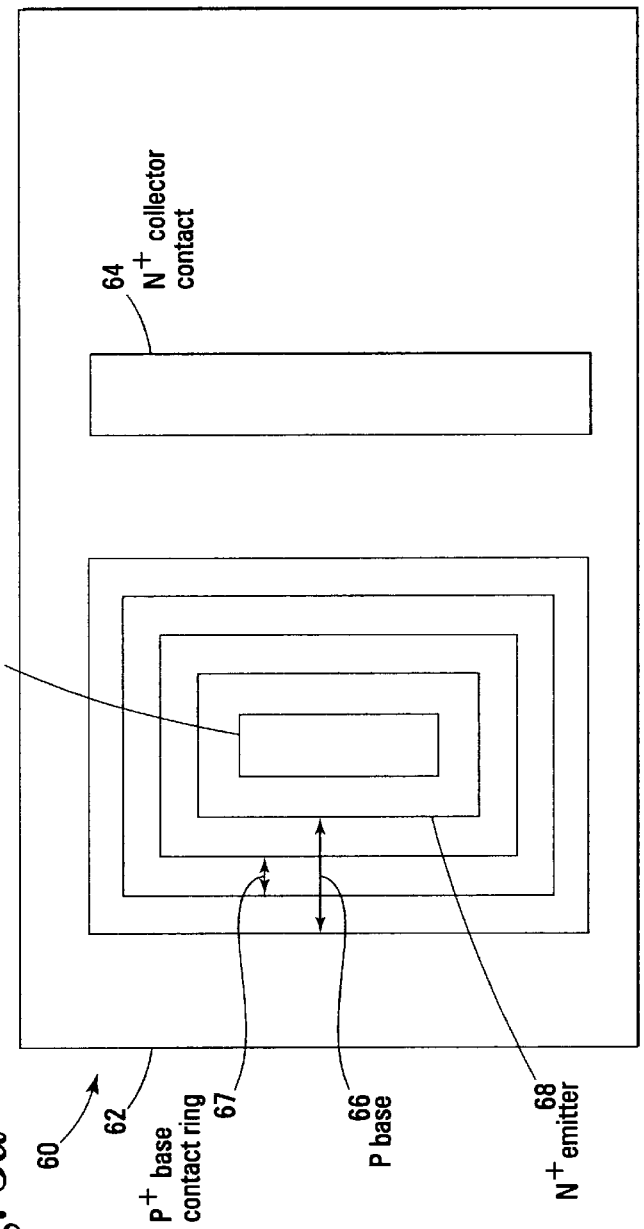
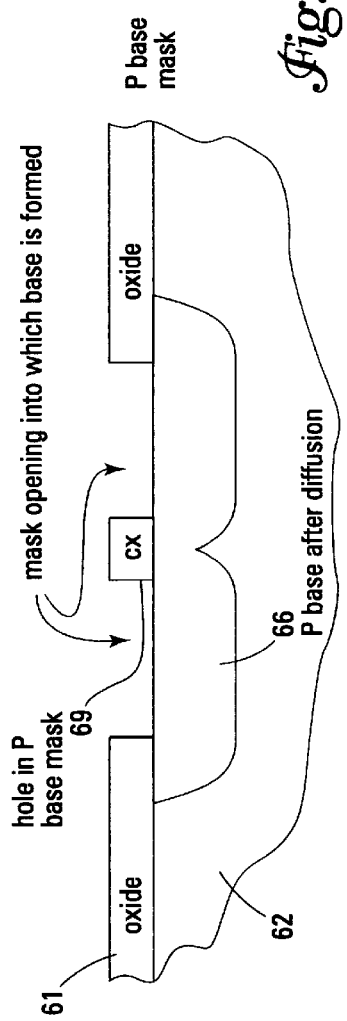

DEVICE WITH PATTERNED WELLS AND METHOD FOR FORMING SAME

BACKGROUND

A number of device parameters can be adjusted by optimizing local doping by appropriate patterning of a well diffusion mask. For example, the breakdown of junctions such as the base collector of a vertical transistor formed with the well as one side can be increased. A patterned well can adjust the threshold of MOS transistors formed in the well. Patterning the well can also adjust the current gain of vertical transistors having the well as base.

Fabrication of vertical bipolar transistor often begins with masking a semiconductor substrate and forming a collector well of a conductivity opposite the conductivity of the substrate. The doping of the collector layer (well) largely sets the collector-base and collector-emitter breakdowns of a vertical bipolar transistor where the base is formed in the well. The junction curvature of the base also influences the breakdown for planar structures because it increases the electric field at any applied voltage. Breakdown is increased when collector doping is reduced because reduced doping allows a wider depletion layer at a given applied voltage. Thus a higher voltage can be applied before reaching the critical field that induces breakdown. Reduced junction curvature also increases breakdown because reducing curvature reduces electric field concentration that is the source of the curvature reduced breakdown.

There are several ways to make the wells in which transistors are formed. One way diffuses the well dopant to achieve the final well depth. The dopants are typically introduced into the same surface in which the base is formed (front surface) but dopants may be introduced below that surface and diffused up until the well extends to the front surface. The well dopant is usually of opposite in conductivity to the region where the well is formed. Collector wells may be isolated from other circuit elements by any of the known isolation methods. Full dielectric isolation using a single poly dielectric isolation method or bonded wafers with trench lateral isolation are preferred methods.

It is often desirable to increase the breakdown voltage of one or more devices formed using the well as collector. A patterned collector to increase transistor breakdown is described in my U.S. Pat. No. 4,532,003. It teaches forming the collector only under the center of the base such that none of the base edge overlaps the collector. A second collector pattern is formed under the collector contact. The two portions of collector are connected by a buried layer thus providing a continuous current path from base to collector contact. The structure of FIG. 1B does not require a buried layer, although one can be used. It has at least a portion of the edge of the base between the emitter and the collector contact overlapping the collector. Use of patterned diffusions to reduce doping concentration is known in the formation of JTE zones as described in U.S. Pat. No. 4,927,772 to S. Arthur et. al. which is owned by Harris Corporation. There are several special considerations which should be applied when using my patterned collector method to improve breakdown that do not apply to the JTE structure which can be used to improve breakdown by patterning the JTE layer which terminates the edge of the base.

An integrated circuit design may require that several of its constituent transistors have higher breakdown voltage than the others or different current gains or threshold voltages. The doping of the well may be too high to achieve the desired parameters for those devices. One way to resolve this problem is to change the well doping. This has the unfavorable effect of increasing the collector resistance for all the lower voltage transistors formed in the same well layer. Another way is to use a second well having doping optimized for that parameter. That adds the cost of patterning and forming the second well to the cost of circuit manufacture.

SUMMARY

The invention provides both a method and apparatus for adjusting the breakdown voltage of a PN junction in a semiconductor device. The PN junction may be the junction of a diode, a transistor, or any other semiconductor device. Transistors include bipolar transistors and MOS transistors. With the invention a first region of one conductivity is formed by masked diffusion of a dopant into the front surface of a semiconductor substrate. A second region of opposite conductivity is formed into a first portion of the first region of the front surface. Parameters of the PN junction, in particular, the breakdown voltage, are controlled by adjusting the mask for the dopant such that one edge of the first region is spaced from the edge of the second region so the doping concentration of the first region at the surface intersection of the four corners of the junction between the first and the second regions is lower than the doping concentration is at some other location, (i.e., in the middle) of the first region. The breakdown is also adjusted by patterning the first region with a striped diffusion pattern. In addition, the striped diffusion pattern can be broken so that there is a gap between stripes.

The invention discloses a bipolar transistor with an adjustable breakdown junction between the collector and the base. The bipolar transistor with adjustable breakdown is formed by diffusing a collector well in the front surface of the semiconductor substrate. The well diffuses to a first depth and has a first surface perimeter defined by a first length and a first width. A base is then diffused into the front surface of the substrate and overlapping the collector well. The base has a second depth and a second surface perimeter defined by a second length and a second width. The length of the base diffused region is enclosed by the collector well diffused region and the width of the base diffused region is about equal to or greater than the width of the collector well diffused region. As such, the base mask has at least one dimension that is equal to or greater than the collector mask.

In another embodiment, the bipolar transistor is formed by using a collector well mask that contains a plurality of stripes. The adjusted breakdown bipolar transistor and normal bipolar transistors with lower breakdown voltages are simultaneously formed. The adjusted breakdown voltage bipolar transistor has a higher breakdown than the other bipolar transistors as a result of the stripes in its mask. The stripes reduce the overall average maximum doping concentration of the collector of the adjusted bipolar transistors. In one variation, the collector contact of the bipolar transistor is spaced from the collector well and also comprises a series of stripes. In another version, the collector contact is spaced and is solid and has fingers extending toward the stripes of the collector well.

The method of the invention can also be used to adjust the current gain of a bipolar transistor. The current gain is adjusted by using a masked diffusion to alter the base width. The base width is the distance between the bottom of the emitter and the top of the collector. In one embodiment, the base is formed by placing a mask consisting of a stripe over the middle of the base diffusion well. That reduces the lateral and vertical diffusion of the base in the center of the base well.

The invention can also adjust the threshold voltage of MOS transistors. The process and structure for adjusting the threshold of the MOS transistors uses a similar structure as the one used to adjust current gain in bipolar transistors. The MOS well is diffused through a mask pattern which includes a stripe which blocks introduction of well dopant. The well dopants are subsequently diffused vertically and laterally such that the well surface concentration in the laterally diffused portion in the region under the stripe is lower than it is in the unmasked area. The lower doping results in a lower threshold for a stripe than for a MOS transistor having a gate formed over the unmasked area.

The inventive devices and the method of the invention are fully compatible with the manufacture of prior art devices. Thus, the inventive devices can be simultaneously integrated and produced with prior art devices. As a result of the invention, those skilled in the art can manufacture integrated circuits with devices having multiple and different breakdown voltages, current gains, and threshold voltages. All of these benefits can be achieved without adding additional steps to the process.

BRIEF DESCRIPTION OF THE DRAWINGS

FIG. 5A is plan view of a patterned well diffusion pattern for adjusting current gain;

FIG. 5B is a sectional view of the patterned well diffusion pattern of FIG. 5a;

FIG. 7b is a section view of the device of FIG. 7a;

FIG. 8 is a modified version of the device of FIG. 7a.

DETAILED DESCRIPTION

Figure 1A:
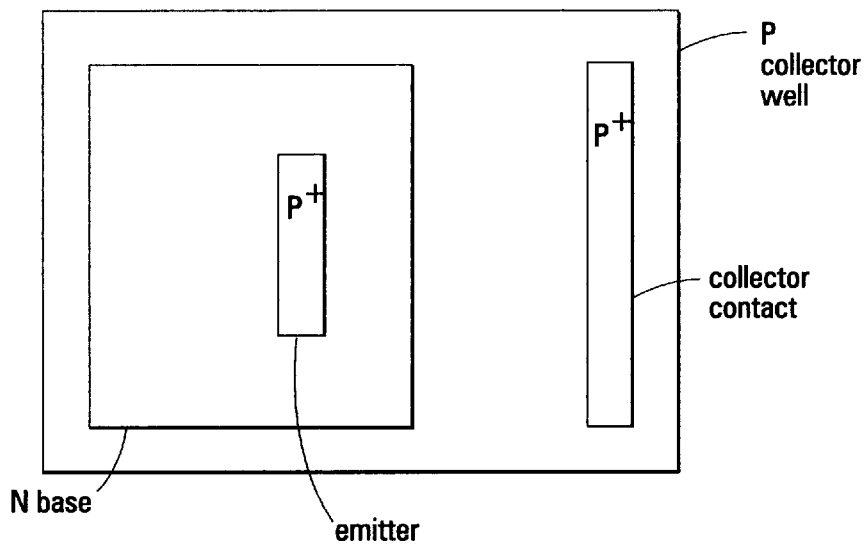
FIG. 1A is a plan view of a prior art bipolar mask diffusion pattern.

The mask pattern of a conventional collector well 12 for a bipolar transistor 10 is shown in FIG. 1A. All device layers are formed by diffusion from the front surface of a semiconductor device 9. The dopant concentration of each of the transistor layers is maximum at the surface and decreases with depth. The dopant concentration also decreases near the mask edge and has a lateral gradient toward zero outside its mask edge. The concentration in the two dimensions when a fixed dopant concentration is diffused is given by $N(x,y) = 0.5\ N_0\ (\exp(-y^2/4Dt))(1+\mathrm{erf}(x/(4Dt)^{0.5}))$. X is the distance from the mask edge into the doped area and y is the depth from the surface.

Wells with higher breakdown transistors can be built with no extra process steps using patterned wells. The patterning reduces the doping in at least a part of the well such that the breakdown limit due to collector doping or curvature is relaxed. Wells not requiring the increased breakdown voltage can be made with the same process steps using the prior art structure of FIG. 1A.

Figure 1B:
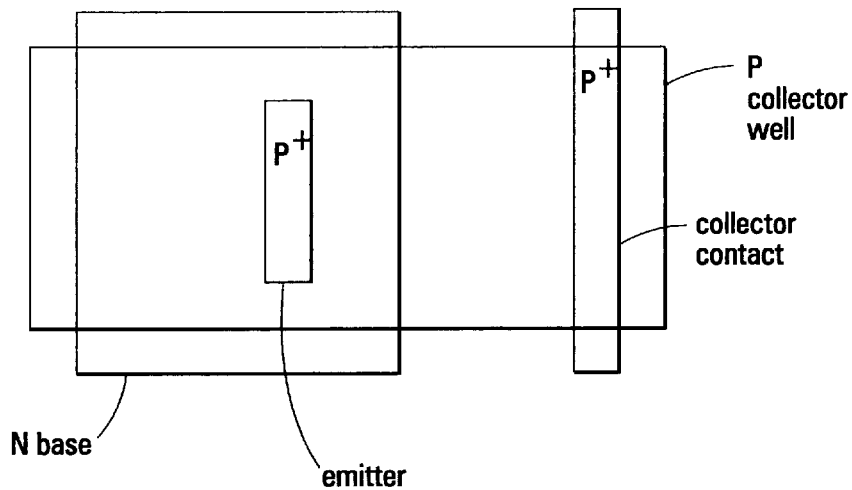
FIG. 1B is a plan view of a mask diffusion well pattern for higher breakdown voltage.

A patterned well for adjusting breakdown voltage is illustrated in FIG. 1B. The device is a bipolar transistor 20. The collector well mask is formed such that the doping of that part of the collector 22 in which the spherically curved part of the base 16 (the result of the intersection of two orthogonal cylindrical surfaces at the the 4 corners) is formed has a lower doping than in the center 23 of the collector. This is accomplished by forming the collector mask edge 24 within the base mask edge 18 at the two ends of the base. This results in a spherical curvature of the base 16 at its four corners (where curvature induced electric field crowding is maximum) being formed in a lower collector doping than the less crowded cylindrical curved edge of the base between the corners.

In one example, two PNP transistors were made in accordance with the geometries of FIGS. 1A and 1B. Both transistors had a 20 micron deep collector diffusion and a 7 micron deep base diffusion. The transistor of FIG. 1A had its collector mask edge 10 microns outside the base mask. Its breakdown voltage was 113V. The transistor made in accordance with FIG. 1B had its collector mask edges 5 microns inside the base mask at the top and bottom. Its breakdown was 132V.

This example and FIG. 1B shows the collector mask 22 inside the ends of the base mask 16 but this is not always necessary. The two masks might be coincident at the ends or the collector mask might be slightly outside the base mask. What is necessary is that the collector mask be close enough to the ends of the base mask to provide reduced collector doping where the corners of the base-collector PN junction are formed.

Breakdown voltage can also be increased by reducing the doping concentration of the collector. The doping can be reduced by using a collector pattern such as stripes. The width of the stripes is preferably less than the depth of the collector diffusion. It is chosen narrow enough that the peak doping of the diffusion within the pattern is less than that obtained using a large aperture. The reduced peak doping results in higher breakdown.

Figure 2A:
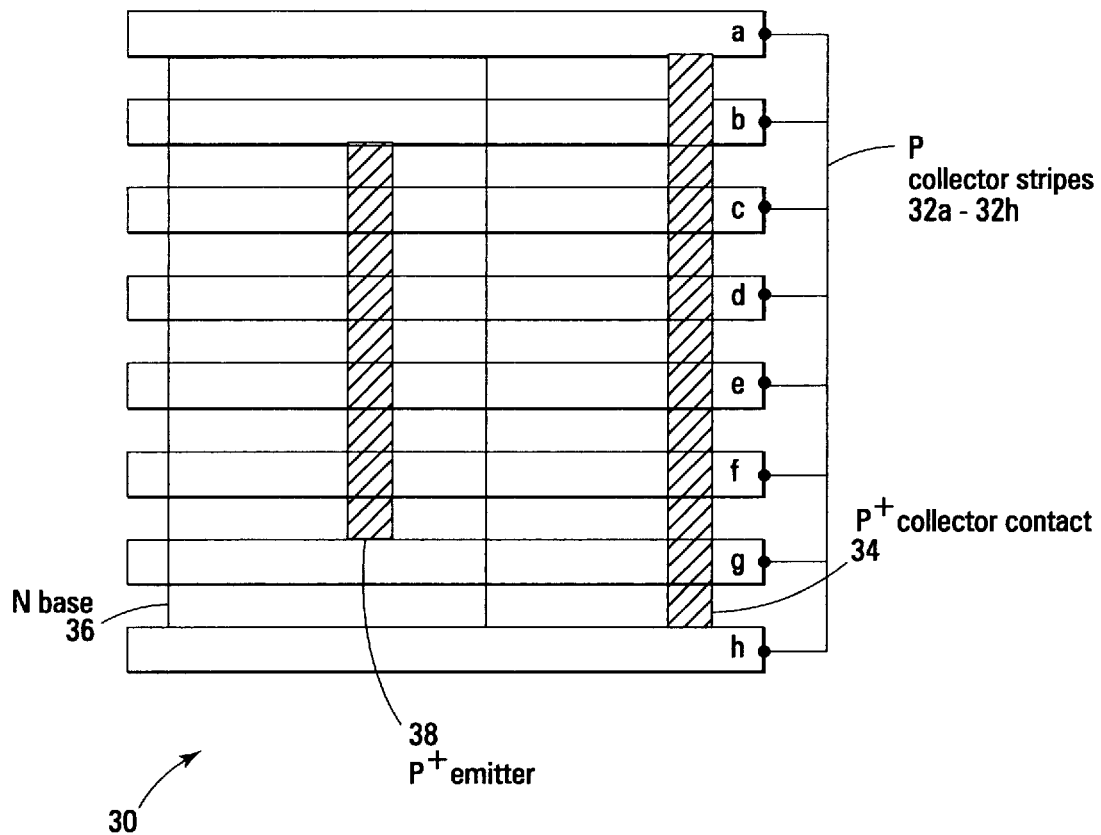
FIG. 2A is a plan view of a striped patterned collector transistor having an improved higher breakdown voltage of one embodiment of the present invention.

A striped patterned collector transistor 30 is shown in FIG. 2A. The collector pattern is composed of narrow stripes 32a–32h separated by narrow spaces. The stripes are narrow enough that the peak doping within the masked area after diffusion is less than it is in a corresponding well pattern without stripes. The spaces between stripes are preferably small enough that the lateral diffusion of the collector from adjacent apertures merges resulting in a continuous collector pattern. The base pattern 36 overlays the stripes 32a–32h. The stripes 32a–32h are oriented in the direction of collector current flow; that is, they run from emitter 38 to collector contact 34. This is done so that the regions of maximum doping (at the center of the collector stripes) can carry collector current from base to collector contact 34 thereby minimizing collector resistance.

Figure 2B:
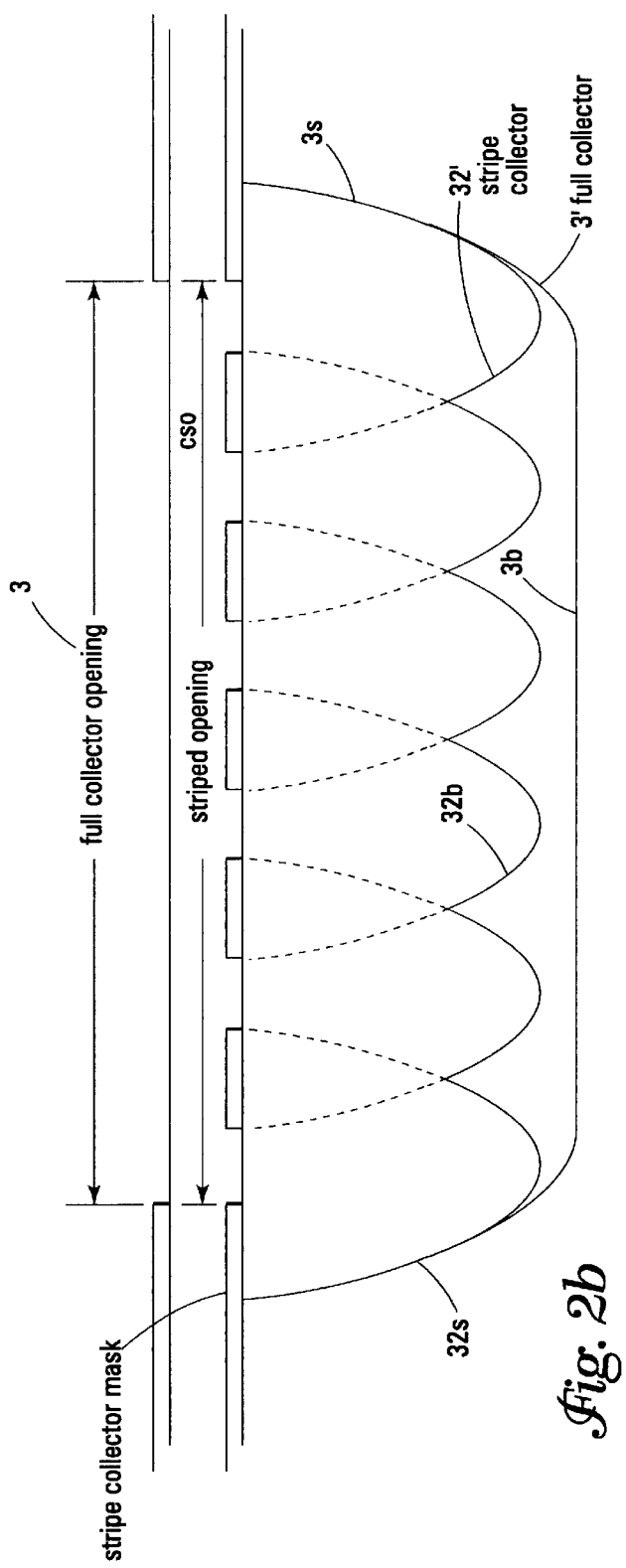
FIG. 2B has sectional views comparing the doping of the collector wells in FIGS. 1A and 2A.
Figure 2C:
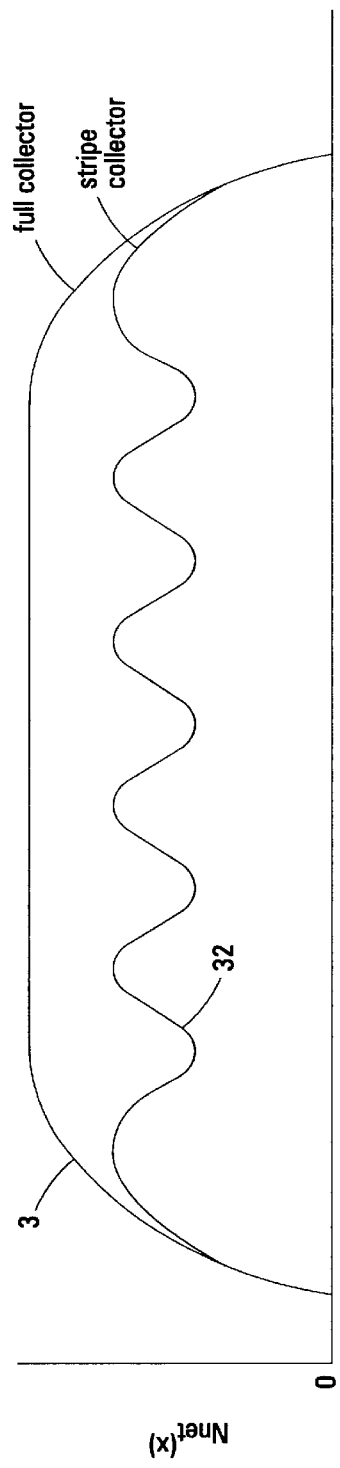
FIG. 2C is graph comparing the doping concentration of the collector wells of FIGS. 1A and 2A.

A full collector opening 3' and a striped collector opening 32' are contrasted in FIG. 2B. The full collector 3' has sides 3s that curve inwardly to a flat bottom 3b of relatively constant concentration. The resultant diffusion 32' of the striped collector mask 32 also has curving sides 32s but has a bottom 32b of variable depth. The surface dopant concentrations of the two wells are shown in FIG. 2B. FIG. 2C is a graph of net dopant concentration, at a depth y from the surface, as a function of the distance X from an edge of the mask into the doped area.

The striped structure 30 can be improved by designing the stripes around the ends of the base such that a minimum in the collector doping (in the center of the space between the stripes) is located where the base comes to the surface at a base lateral diffusion distance outside the base mask. The base corner breakdown limit can also be improved by eliminating the collector stripes outside the base to achieve an effect similar to that of the device in FIG. 1B.

Figure 3:
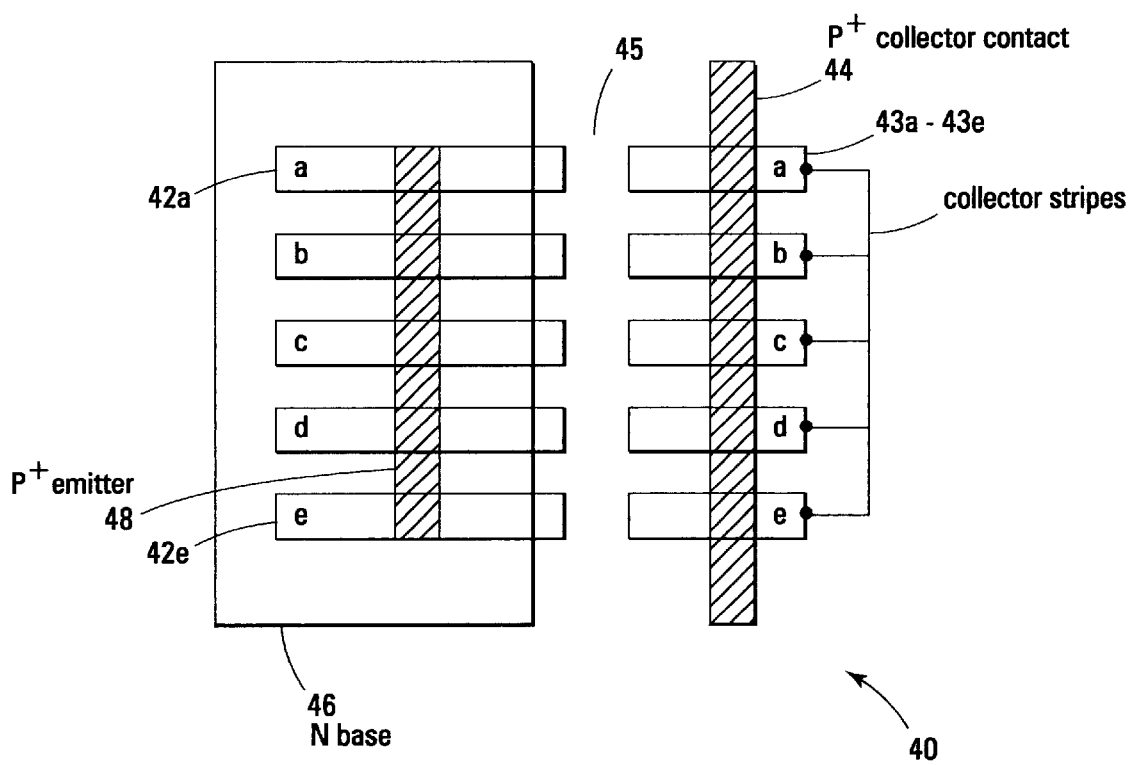
FIG. 3 is a plan view of a separated striped mask diffusion well pattern for higher breakdown voltage.

Still further breakdown improvement can be achieved by using the separated striped pattern 42a–42e of FIG. 3 to reduce the doping in the collector at all the surface edges of the base rather than just at the corners. The transistor 40 has collector stripes 42a–42e segmented with a gap 45 in the stripes where the base 46 intersects the surface between the emitter 48 and collector contact 44. This could also have been done on the side of the base opposite the collector contact. Since no collector current flows there, the collector stripes were simply pulled back as they are at the ends of the base.

Figure 4:
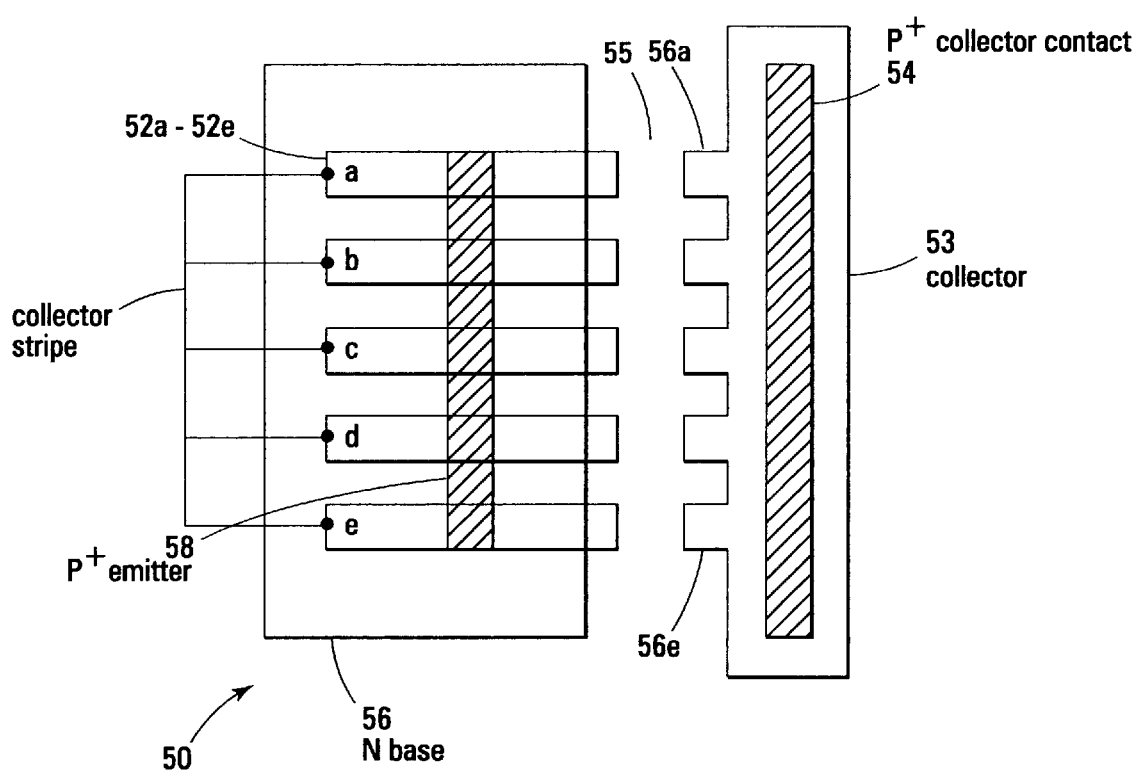
FIG. 4 is a plan view of another separated striped mask diffusion well pattern for higher breakdown voltage.

As further shown in FIG. 4, the collector 53 can be made solid in regions far enough away from the base 56 without degrading breakdown voltage. This might be done around the collector contact as illustrated in FIG. 4 to reduce collector resistance. The transistor 50 has a striped collector well 52a–52e with the emitter 58 inside the base 56. The gap 55 between the base 56 and the solid collector 54 prevents the breakdown voltage from degrading. The solid collector 54 has fingers 56a–56e that extend toward the ends of corresponding stripes 52a–52e.

Test devices were been built using several of the geometries described above. A device like the device 30 of FIG. 2 was built with 4 micron wide collector stripes 32a–32e spaced 5 microns apart. It had a breakdown of 162V. Another device similar to that of transistor 40 in FIG. 3 had a 5 micron gap in the stripes starting 5 microns outside the base mask edge. It achieved a breakdown of 193V. Another FIG. 3 type device built with identical geometry except for increasing the space between base and collector contact diffusion by 15 microns had a breakdown of 238V. An identical device with a full collector (like FIG. 1A) had a breakdown of 115V showing that the base to collector contact spacing did not limit the breakdown of the prior art device.

All devices described here were built in the same silicon wafer using a single collector well mask and a single collector doping step. The range of breakdowns achieved illustrates the potential of the patterned collector structures described here to selectively adjust the breakdown of a device to meet its circuit requirement. The devices described above are bipolar devices but the principles can be applied to any PN junction in which the lightly doped side is a diffused well. Thus the invention in is broader aspects covers all PN junctions made with wells patterned to adjust breakdown, and, in particular, to integrated circuits with PN junctions formed at the same time and having different breakdown voltages due to different well patterns. In the specific examples, the junction so formed is the base collector junction of a bipolar device.

Patterned wells also can be used to adjust current gain, HFE, of bipolar transistors. This is achieved by forming the base from the well. The base mask includes a narrow masked area where the emitter will be formed. The base well diffuses laterally under both sides of the mask with the two laterally diffusing edges merging to form a continuous base region under the mask as shown in FIGS. 5A, 5B.

The transistor 60 optionally has a collector well 62. Inside the collector well an oxide mask 61 forms the outside edges of the base well. Inside the base well a further oxide strip 69 forms a hole in the doping of the base well 66. The laterally diffused part of the base is shallower. Its doping profile can be approximated by calculating each laterally diffused portion using the equation given previously and superposing them. The wider the central mask stripe 69, the shallower the overlap region of the base under the mask stripe 69.

Figure 5C:
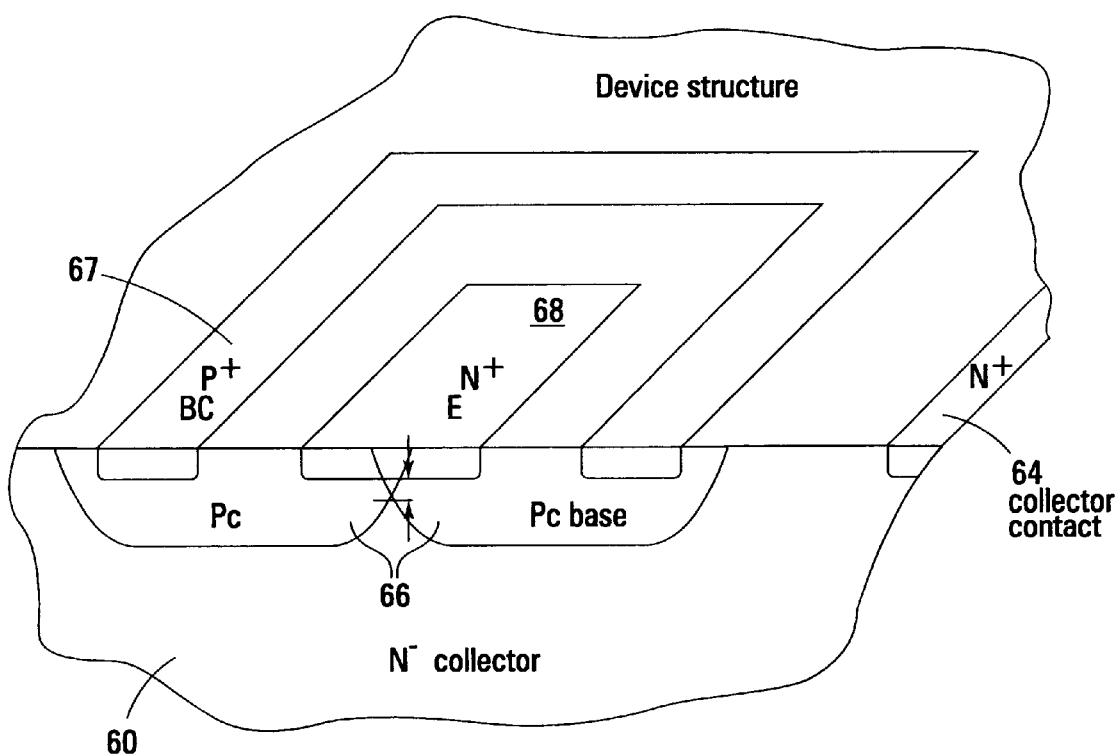
FIG. 5C is a partial perspective sectional view of the patterned diffusion pattern of FIG. 5A.

An emitter 68 is formed over the masked strip of the base as shown in FIG. 5C. The current gain of transistor 60 is inversely proportional to the net doping of the base between the bottom of the emitter and the collector. The net doping is reduced when the mask strip 69 is made wider. This provides the means to create mask adjustable HFE.

Several device parameters change when the net base doping is changed. The current gain, HFE, increases as net doping decreases as described above. Early voltage, VA, decreases as net base doping decreases. Breakdown voltage, collector emitter open, BVCEO, also decreases as net base doping decreases. For net base doping sufficiently low, the transistor breakdown is limited by punch through rather than avalanche. When this occurs the breakdown voltage, collector base open BVCBO as well as BVCEO drops and both decrease as net base doping decreases. All these variations are known in standard transistor theory.

In a test to evaluate this device structure, NPN devices were made with a 9 micron deep diffused well base and a 2 micron deep emitter. The following results were obtained:

| width of masked area in base in microns | HFE | BVCEO in V |
| --- | --- | --- |
| 8 | 475 | 40 |
| 12 | 700 | 30 |
| 14 | 1400 | 6 |

These results demonstrate that a wide range of device parameters can be obtained in a simple process. The different parameters are achieved using a single base mask step and a single base doping step. This is more cost effective than prior art methods which use multiple base or emitter masking and doping steps to achieve different transistor parameters in the same wafer and circuit.

Figure 6:
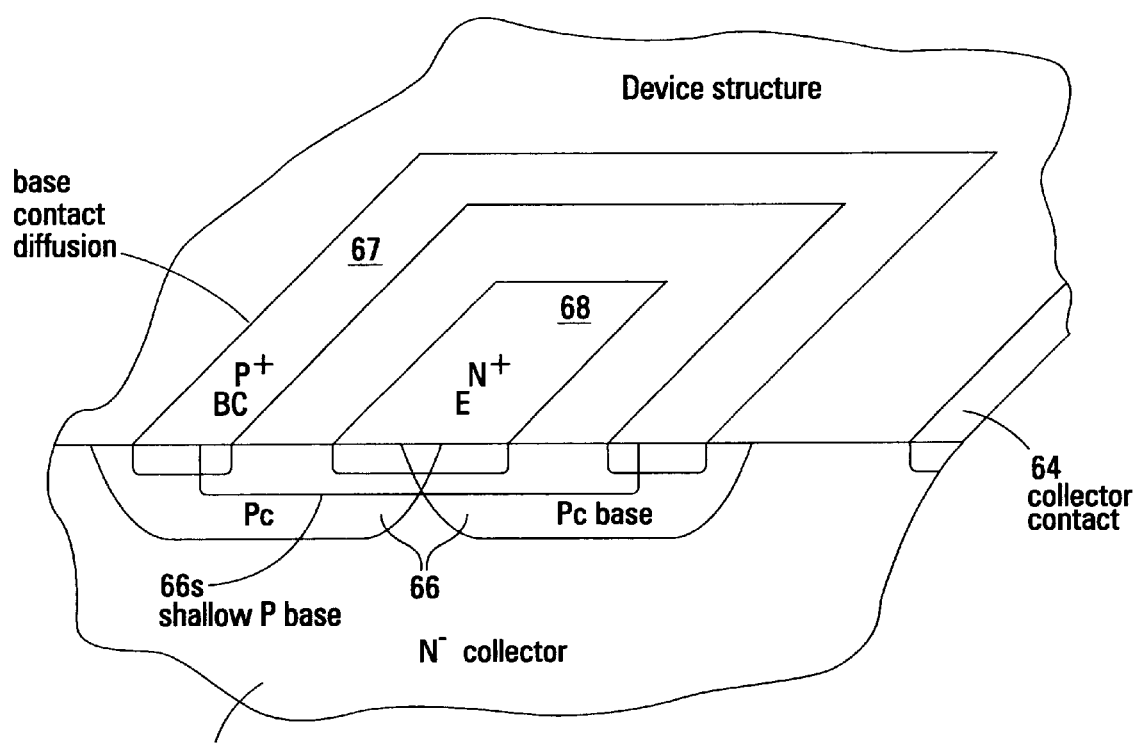
FIG. 6 is a partial perspective sectional view of another patterned diffusion pattern for adjusting current gain.

A variation on mask adjustable base width device is illustrated in FIG. 6. It is identical to the structure of FIGS. 5A, 5B except for the addition of a second shallow base region 66s which combines with the well base 66. The shallow base 66s increases the integrated doping under the emitter 68 while not changing the base width (the distance from the bottom of the emitter to the collector).

The frequency response of the device, Ft, is set largely by the base width while the breakdown and current gain are set by the net doping. They are independently adjustable in this structure: base width is set by mask width, net doping is set by the doping profile of the shallow base, given the profile of the well base. Thus, Ft and breakdown can be independently adjusted using this structure.

A ring shaped P+ base contact diffusion 67 is shown in FIGS. 5a, 5c and 6. The base contact is optional. When used, it need not be ring shaped.

The threshold of MOS devices built in a well can be adjusted using a patterned well. Specifically, lower threshold voltage can be achieved by forming a narrow mask region under the region where the gate will subsequently be formed. The well will laterally diffuse in from the two masked edges and overlap similar to the masked base for the bipolar transistor. The net doping is lower in the center of the masked region. The wider the masked region, the lower the doping. Lower doping gives a lower threshold voltage.

Figure 7A:
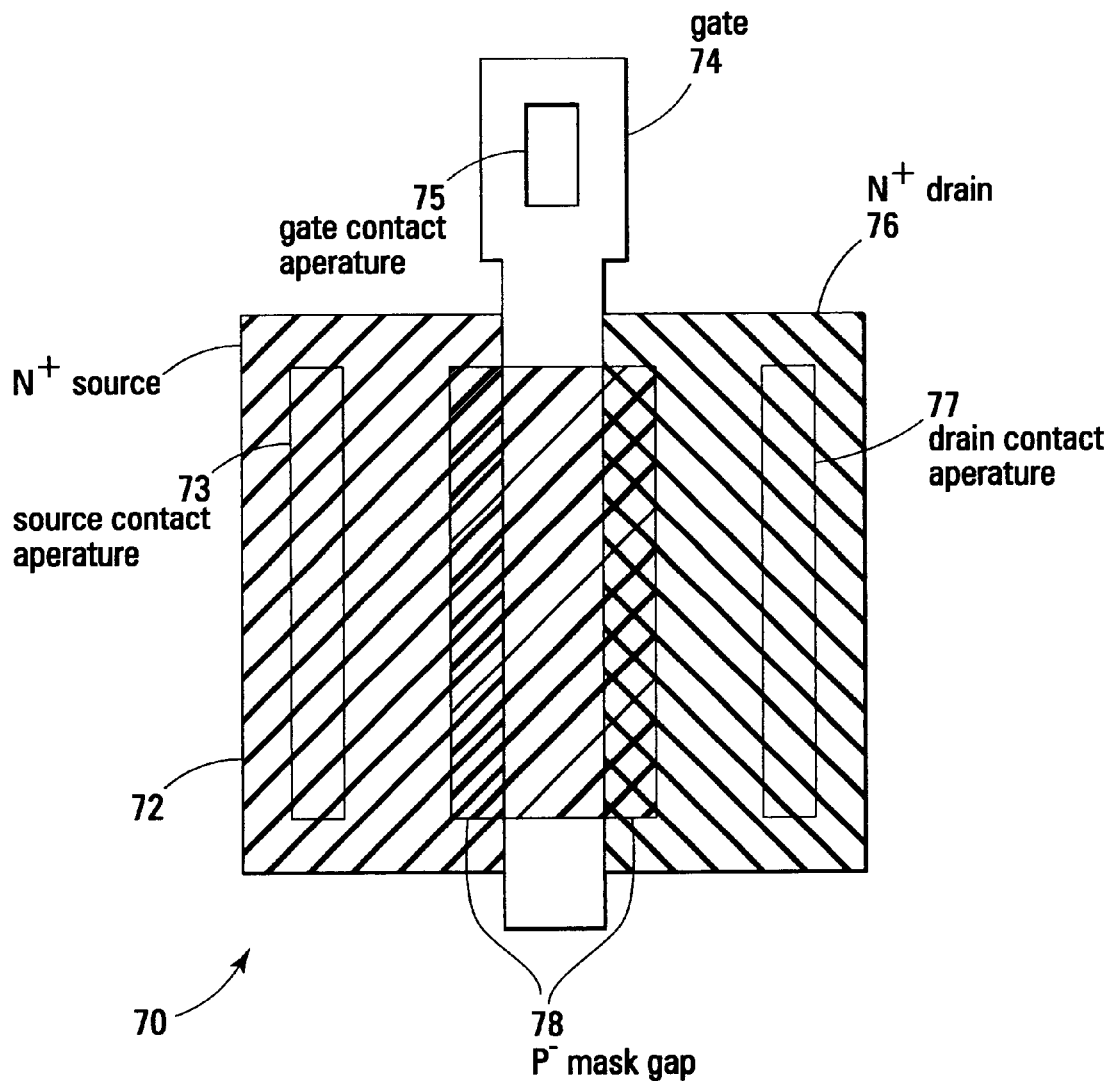
FIG. 7a is a plan view of a patterned well diffusion pattern for adjusting threshold of an MOS transistor.
Figure 7B:
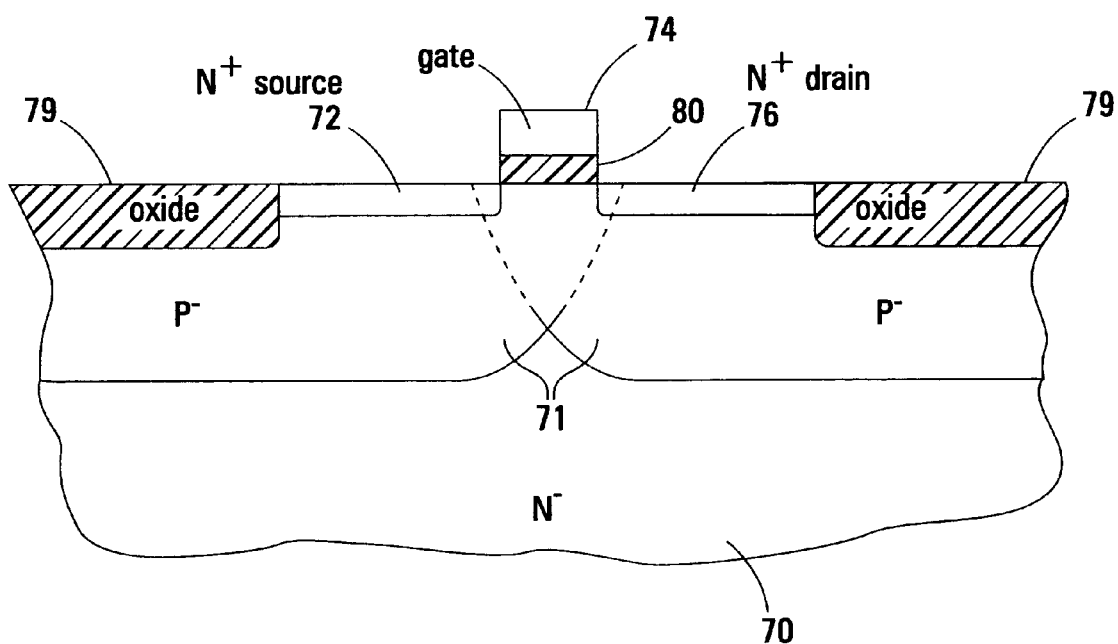

The mask pattern for such an MOS device 70 is shown in FIG. 7A. Referring to FIG. 7B, the well 71 is formed first. A thin oxide 80 is preferably formed after the well 71 has been diffused into the substrate. The gate 74 is formed on the thin oxide 80 after the well 71 diffusion. The source 72 and drain 76 are preferably formed using conventional self alignment techniques after gate formation.

The device 70 is shown in cross section in FIG. 7B. The broken lines show the lateral extent of the well 71 which has diffused under the well mask. The well mask has subsequently been removed. There is a thin gate oxide 80 between the bottom of the gate 74 and the surface of the well and over the N+ source 72 and drain 76 which are not explicitly shown. Further conventional processing is used to complete the device 70 and provide insulation over the gate 74 and conductors (not shown) connected to drain, source and gate.

Figure 8:
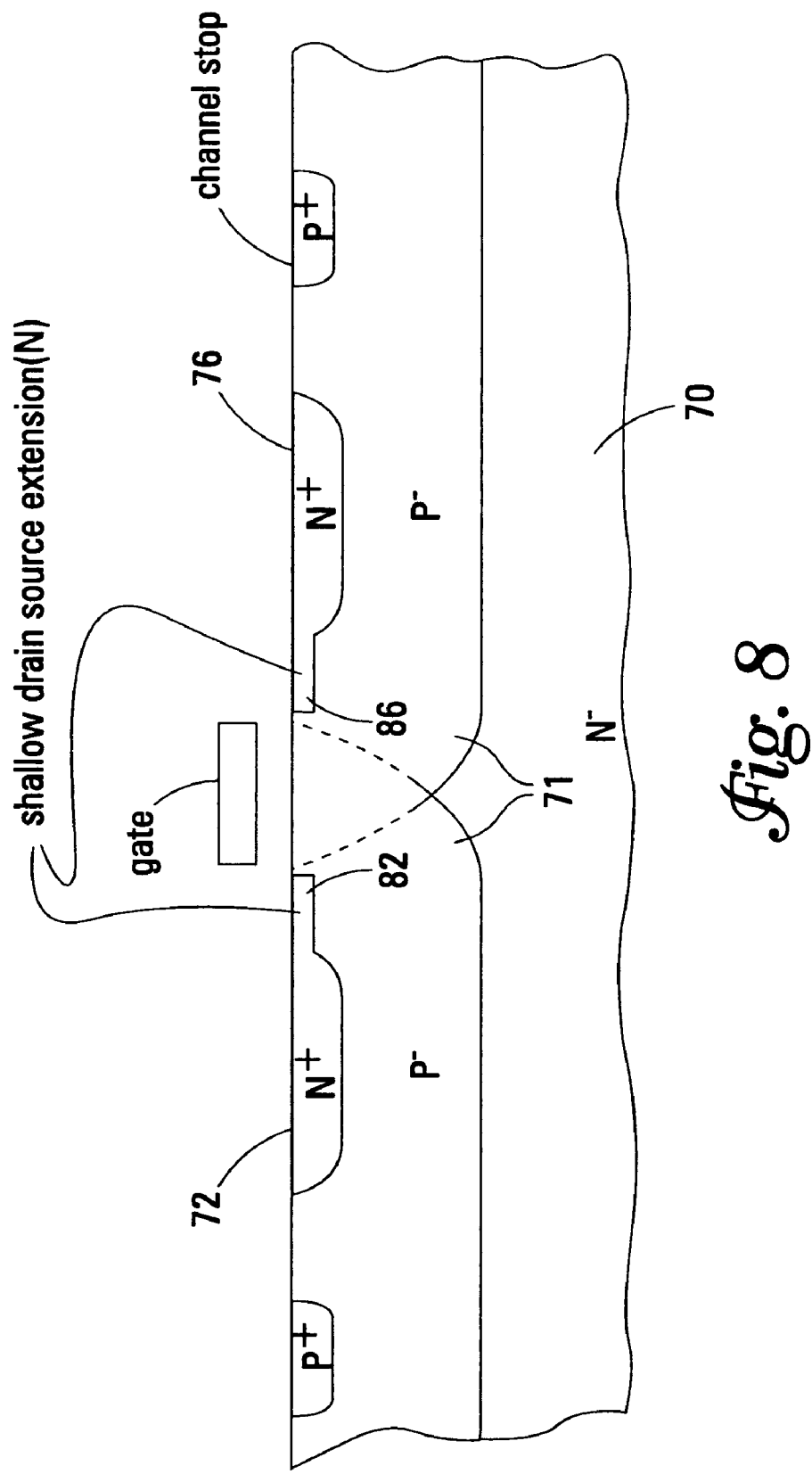

One limitation on the use of the structure of FIGS. 7A, 7B is that the drain to source and drain to N– substrate breakdown voltages will be reduced if the well mask is made too wide. This occurs because the drain to substrate distance is reduced and the net doping between drain and source and between drain and substrate is reduced as mask width is increased. Use of drain and source extensions which are shallower than the distance from drain to source can reduce this limitation. Such a structure is illustrated in FIG. 8. The extension 82, 86 are connected to the source 72 and drain 76, respectively. Note that the deeper N+ drain 76 and source 72 contact regions are located over parts of the well which have not been masked and have maximum depth. Devices of this type have been built using a 9 micron deep well, 2 micron deep N+, approximately 0.15 micron deep drain source extensions and a gate length of 5 microns. The results were:

| Width of gap in well (microns) | Threshold voltage (volts) |
| --- | --- |
| 0 | 1.25 |
| 8 | 0.80 |
| 11 | 0.68 |
| 12 | 0.53 |

The patterned well can be used to produce multiple threshold devices with no extra process steps. One application for such devices is the known voltage reference circuit which derives the voltage from the difference in threshold of two MOS devices. Previous methods for producing such devices require adding a mask and a doping step to the process.

What I claim is:

1. In an improved integrated circuit having two or more semiconductor devices electronically isolated from each other, the improvement comprising:

at least one transistor comprising a semiconductor substrate with a top surface, a PN junction between a first region of one conductivity type formed by masked diffusion into said substrate from said top surface and a second region of opposite conductivity type formed into a first portion of said first region from said top surface, edges of said first region being spaced from associated edges of said second region such that the doping concentration of said first region at the surface intersection of corners of the junction between said first and second regions is lower than it is at some other location in said first region.

2. The improved integrated circuit of claim 1 wherein said first region has a striped diffusion pattern in which adjacent stripes are close enough together that the diffusion from them extends laterally to merge to form a continuous first diffused region of variable doping concentration in planes parallel to said top surface.

3. The improved integrated circuit of claim 2 wherein said stripes have gaps located such that the maximum doping of said first region at said surface intersection of said junction between said first and second regions is lower that it is at some other part of said first region.

4. The improved integrated circuit of claim 2 wherein said at least one transistor is a bipolar transistor wherein said first region corresponds to a collector well and said second region corresponds to a base.

5. The improved integrated circuit of claim 4 further comprising a collector contact region of said first conductivity type in said collector well and outside said base and an emitter of said first conductivity type in said base, wherein at least one stripe of said collector well extends from under said emitter to under said collector contact region.

6. The improved integrated circuit of claim 1 wherein said at least one transistor is a bipolar transistor wherein said first region corresponds to a collector well and said second region corresponds to a base.

7. A bipolar transistor comprising:

a semiconductor substrate having top and bottom surfaces;

a collector well diffused region in the substrate extending from the top surface into the substrate a first depth and having a first surface perimeter defined by a first length and a first width;

a base diffused region in the substrate and overlapping the collector well diffused region, said base diffused region extending from the top surface into the substrate a second depth and having a second surface perimeter defined by a second length and a second width wherein the length of the base diffused region is enclosed by the well diffused region and the width of the base diffused region is about equal to or greater than the width of the collector well diffused region; and an emitter diffused region disposed with and surrounded by the based diffused region;

wherein the collector well diffused region and the base diffused region each has a doping concentration that decreases with depth and with proximity to the respective perimeters, and the doping concentration of the collector well diffused region at the surface intersection of the junction between the collector well diffused region and the corners of the base diffused region is less than the maximum doping concentration of the collector well diffused region at locations of the collector well region that overlap the base diffused region.

8. The bipolar transistor of claim 7 wherein the collector well diffused region comprises substantially uniform doping in planes parallel to the top surface a select distance within said perimeter of the collector well diffused region.

9. In an improved integrated circuit having two or more semiconductor devices electrically isolated from each other, the improvement comprising:

at least one bipolar transistor comprising:

a semiconductor substrate having top and bottom surfaces;

a collector well diffused region in said substrate extending from said top surface into the substrate a first depth and having a first surface perimeter defined by a first length and a first width;

a base diffused region in said substrate and overlapping said collector well diffused region, said base diffused region extending from said top surface into said substrate a second depth and having a second surface perimeter defined by a second length and a second width, wherein the length of said base diffused region is enclosed by said collector well diffused region and the width of said base diffused region is about equal to or greater than the width of said collector well diffused region; and an emitter diffused region diffused with and surrounded by said base diffused region;

wherein said collector well diffused region and said base diffused region each has a doping concentration that decreases with depth and with proximity to the respective perimeters, and the doping concentration of said collector well diffused region at the surface intersection of the junction between said collector well diffused region and the corners of said base diffused region is less than the maximum doping concentration of said collector well diffused region at locations of said collector well region that overlap said base diffused region.

10. The improved integrated circuit of claim 9 wherein said collector well diffused region comprises substantially uniform doping in planes parallel to said top surface a select distance within said perimeter of the collector well diffused region.

11. In an improved integrated circuit having two or more semiconductor devices electronically isolated from each other, the improvement comprising:

at least one semiconductor device comprising a substrate having top and bottom surfaces;

a collector well diffused region in the substrate having a first surface perimeter and extending from the top surface into the substrate to variable depths such that a plurality of shallower portions are formed between adjacent deeper portions;

a base diffused region in the substrate, said base diffused region extending from the top surface into the substrate a second depth and having a second surface perimeter lying entirely within said first surface perimeter;

an emitter diffused region disposed with and surrounded by the base diffused region; and a collector contact diffusion spaced from the base diffused region and extending from the top surface of the substrate into the collector well diffused region.

* * * * *